(12) United States Patent
Hale et al.

(10) Patent No.: US 6,206,966 B1
(45) Date of Patent: Mar. 27, 2001

(54) PEDESTAL SUBSTRATE FOR COATED OPTICS

(75) Inventors: Layton C. Hale, Livermore; Terry N. Malsbury, Tracy, both of CA (US); Steven R. Patterson, Concord, NC (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 09/164,414

(22) Filed: Sep. 30, 1998

(51) Int. Cl.[7] .................................................. B05C 13/00
(52) U.S. Cl. ............................................................ 118/500
(58) Field of Search ............................ 359/527, 601–603; 248/474, 476; 118/500

(56) References Cited

U.S. PATENT DOCUMENTS

| | | | |
|---|---|---|---|
| 2,466,625 | * 4/1949 | Ulmer | 359/397 |
| 3,198,070 | * 8/1965 | Platzer et al. . | |
| 3,743,473 | * 7/1973 | Von Suskil | 431/297 |
| 4,991,815 | * 2/1991 | Softness | 248/487 |
| 5,035,495 | 7/1991 | Toyoda et al. | 350/588 |
| 5,462,603 | 10/1995 | Murakami | 118/719 |
| 5,569,350 | 10/1996 | Osada et al. | 156/345 |
| 5,691,849 | * 11/1997 | Ledroit et al. | 359/603 |
| 5,748,435 | 5/1998 | Parkhe | 361/234 |
| 5,986,795 | * 11/1999 | Chapman et al. | 359/224 |

FOREIGN PATENT DOCUMENTS 0 14 998 A2  6/1996 (EP) .

* cited by examiner

*Primary Examiner*—Richard Crispino
*Assistant Examiner*—George R Koch, III
(74) *Attorney, Agent, or Firm*—Daryl S. Grzybicki; L. E. Carnahan; Alan H. Thompson

(57) ABSTRACT

A pedestal optical substrate that simultaneously provides high substrate dynamic stiffness, provides low surface figure sensitivity to mechanical mounting hardware inputs, and constrains surface figure changes caused by optical coatings to be primarily spherical in nature. The pedestal optical substrate includes a disk-like optic or substrate section having a top surface that is coated, a disk-like base section that provides location at which the substrate can be mounted, and a connecting cylindrical section between the base and optics or substrate sections. The connecting cylindrical section may be attached via three spaced legs or members. However, the pedestal optical substrate can be manufactured from a solid piece of material to form a monolith, thus avoiding joints between the sections, or the disk-like base can be formed separately and connected to the connecting section. By way of example, the pedestal optical substrate may be utilized in the fabrication of optics for an extreme ultraviolet (EUV) lithography imaging system, or in any optical system requiring coated optics and substrates with reduced sensitivity to mechanical mounts.

22 Claims, 6 Drawing Sheets

PEDESTAL SUBSTRATE FOR COATED OPTICS

PEDESTAL SUBSTRATE FOR COATED OPTICS

The United States Government has rights in this invention pursuant to Contract No. W-7405-ENG-48 between the United States Department of Energy and the University of California for the operation of Lawrence Livermore National Laboratory.

BACKGROUND OF THE INVENTION

The present invention relates to optical substrates, particularly to optical substrates that contain coated reflective optics, and more particularly to a pedestal type optical substrate that maintains acceptable figure before or after coating, is not sensitive to mount disturbance loads, and demonstrates high dynamic stiffness.

Optics for extreme ultraviolet (EUV) lithography imaging systems, for example, require coated reflective optics that are precisely figured at the angstrom level. In such reflective optics, the optical substrates are first figured, then coated with a film of material that is reflective in the ultraviolet wavelengths. Unfortunately, the coated film has a residual stress that causes the substrate to deform from its desired figure. It has been shown that for a disk-like optical substrate, the nonspherical component of the figure distortion decreases as the aspect ratio (width divided by height) of the substrate increases. Thus, while thinner substrates deform more due to the coating, the deformation is primarily spherical. In many cases an imaging system is relatively insensitive to spherical changes in an individual optic. Thus, a thinner substrate reduces the negative effect of coating residual stress.

The coated optics must be assembled into the imaging system using some form of mechanical attachment. The mechanical attachment, referred to as the optical mount, must physically attach to the substrate. This attachment provides a mechanism through which undesired figure distorting forces and moment can be applied to the substrate. There are many sources of these disturbance inputs, including system temperature changes, distortion of their imaging system structure, and residual stress due to the mounting process. The sensitivity of the optics surface figure is directly related to the mechanical stiffness of the substrate. An infinitely stiff substrate would not deform due to these inputs. A realistic, disk-like substrate will always demonstrate a level of sensitivity to these mount induced disturbance loads. The lower the aspect ratio of a disk-like substrate, the lower the optic's sensitivity to disturbance loads. Thus, a thicker substrate reduces the sensitivity of a substrate to disturbance loads.

Frequently, there is a requirement that an optical substrate demonstrates a high degree of dynamic stiffness. A low aspect ratio substrate generally provides for more favorable (higher) dynamic stiffness.

The problem is that while a thinner substrate reduces negative coating effects, it may not provide the necessary stiffness and insensitivity to mount disturbances. The present invention, which involves a pedestal substrate, addressees the need to have an optical substrate that maintains acceptable figure before or after coating, is not sensitive to mount disturbance loads, and demonstrates high dynamic stiffness. The pedestal substrate of the present invention comprises the basic components: 1) a disk-like optic or substrate section, the top surface of which is to be coated with reflective material, 2) a disk-like base section, and 3) a connecting section between the base and optic or substrate sections. These three sections may be formed as a monolith from a solid piece of material, the optic or substrate section and the connecting section may be formed from a solid piece, or the three sections and being formed individually and secured together. The pedestal substrate approach of the present invention permits the optic component designer to independently control the effects of residue coating film stress, mount disturbance loads, and substrate dynamic stiffness.

SUMMARY OF THE INVENTION

It is an object of the present invention to provide an improved substrate for both coated and uncoated optics.

A further object of the invention is to provide a pedestal substrate for coated optics.

A further object of the invention is to provide a pedestal substrate for coated optics comprising a substrate section, a base section, and a connector section.

Another object of the invention is to provide a pedestal optical substrate that simultaneously provides high substrate dynamic stiffness, low surface figure sensitivity to mechanical mounting hardware inputs, and constrains surface figure changes caused by optical coatings to assume a desired form, for example, spherical.

Another object of the invention is to provide a pedestal substrate which includes a disk-like optic section, a disk-like base section, and a connecting section between the base and optic sections.

Another object of the invention is to provide a pedestal substrate having three sections formed from a solid piece of material.

Another object of the invention is to provide a pedestal substrate containing a substrate section, a base section, and a connector section, wherein the substrate section and connector section are integral.

Another object of the invention is to provide a pedestal substrate having a substrate section, a base section, and a connector section, wherein the connector section is connected to at least the base section, at three equally spaced points.

Other objects and advantages of the present invention will become apparent from the following description and accompanying drawings. The present invention involves a pedestal substrate for coated optics. The pedestal substrate of this invention provides an optical substrate that maintains acceptable figure after coating, is not sensitive to mount disturbance loads, and has high dynamic stiffness. Thus, the present invention provides an optical component for extreme ultraviolet (EUV) lithography imagine systems or any optical system requiring coated optics and/or substrates with reduced sensitivity to mechanical mounts. The invention involves a pedestal substrate composed of three basic elements: 1) a disk-like optic section having a top surface that requires coating, 2) a disklike base section, and 3) a connecting section between the base and optic sections. The connecting section may be a separate component secured to both the optic section and the base section, may be integral with the optic section, or may be integral with the optic and base sections. The connecting section, if separate from the base section, is secured to the base section, at three equally spaced locations, and if separate from the optic section, may be secured thereto at three or more points or may be continuously secured. The connecting section may be triangular, but preferably cylindrical, and may be hollow, and connected to at least the base section by three spaced protruding legs which extend into openings in the base section and bonded or otherwise secured thereto. Also, the connecting section may extend into an opening in the base section with the base section having three spaced protruding members which contact the connecting section and are secured thereto. The connecting section may be similarly secured to the optic section, but preferably the connecting section is integral with the optics section, and may be solid or hollow. The three basic components of the pedestal substrate of the invention are preferably fabricated from a low thermal expansion glass or from low thermal expansion ceramics such as Zerodur, ULE, or Zerodur M.

BRIEF DESCRIPTION OF THE DRAWINGS

The accompanying drawings, which are incorporated into and form a part of the disclosure, illustrate embodiments of the invention and, together with the description, serve to explain the principles of the invention.

DETAILED DESCRIPTION OF THE INVENTION

Figure 1:
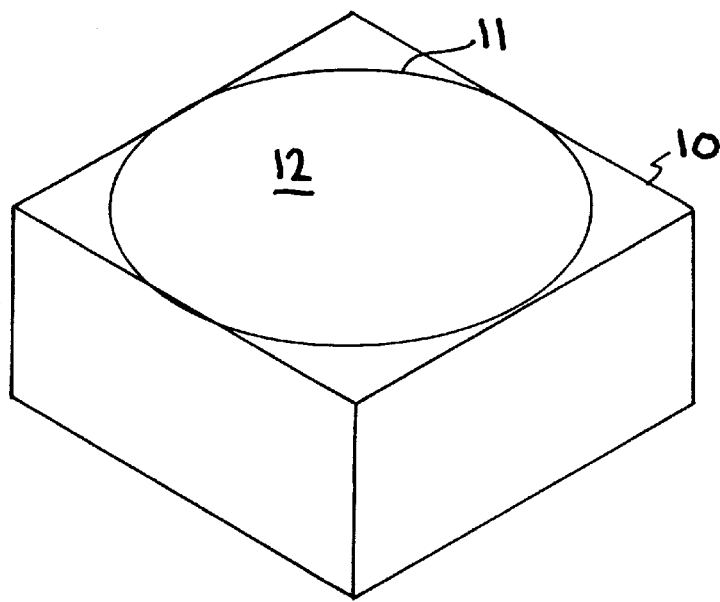
FIGS. 1–5 illustrate the fabrication of an embodiment of a pedestal substrate made in accordance with the present invention.

The present invention is directed to a pedestal substrate for coated or uncoated optics. The pedestal optical substrate simultaneously provides high substrate dynamic stiffness, low surface figure sensitivity to mechanical mounting hardware inputs, and provides control over the surface figure changes caused by optical coatings, for example, making them to be primarily spherical in nature. The pedestal substrate of this invention has the following five distinctive features:

1. A disk-like optic or substrate section that is figured to the optical prescription, with the top surface of this section being the optical surface and the surface that requires coating.

2. A disk-like base section that provides locations at which the substrate can be mounted.

3. A connecting section between the base and optic or substrate sections.

4. The connecting section attaches to at least the base section through three distinct members or legs.

5. Sections of the pedestal substrate can be a monolith formed from a solid piece of material avoiding joints and the dimensional uncertainty that comes with jointed structures.

The optic section of the pedestal substrate can be designed such that its aspect ratio and/or cross section is as required to constrain coating residual stress deformation as desired. For example, this section can have a constant cross section with an aspect ratio of 5 to 10 so that the coating causes primarily spherical deformation. The cross section may be non uniform to cause other desirable figure changes.

The intersection of the connecting section with the optic section can be designed to influence the residual stress deformation of the optic section as desired. For example, using a hollow, right circular cylinder as a connecting section to a thin (10 to 20 mm) optic section results in primarily spherical deformation due to a constant valued residual stress. Variations of the connecting section attachment to the optic section can be made to influence the residual film stress caused deformations in other ways or to control effect related to varying residual stress.

The connecting section preferably attaches to the base section through three legs equally spaced in angle about the optic section axis. The drawings, described hereinafter, set forth acceptable approaches to attaching the connecting section and the base section. A similar multi-leg or continuous attachment may be used to attach the connecting section to the optic section, if these two sections are not formed integral. The use of three symmetric legs reduce deformation of the optical surface due to deformations of the base section. This form of attachment tries to force deformations of the base section to cause primarily rigid body type motions of the optical surface. This reduces the sensitivity of the optical figure to disturbance loads at the mounting locations. The connecting section may be solid, though preferably hollow, and it may be of a triangular configuration with a three leg attachment approach.

The base section can be designed such that its aspect ratio is required to control the sensitivity of the optical surface to disturbance loads input at the mounting locations. For example, the base section can be made thick (20 to 30 mm) to improve (reduce) the deformations due to disturbance loads, but the sizes could be changed depending on the application.

It is thus seen that the role of the base section is to transfer disturbance loads to the other mounting locations with minimal distortion of the base section. The connecting section isolates the optical surface from the base section distortions that do occur. The optic or substrate section can be figured as specified and can be designed to deform in a prescribed manner due to coating film residual stress. The pedestal substrate of this invention, thus permits the designer to independently control the effects of residual coating film stress, mount disturbance loads and substrate dynamic stiffness.

Figure 2:
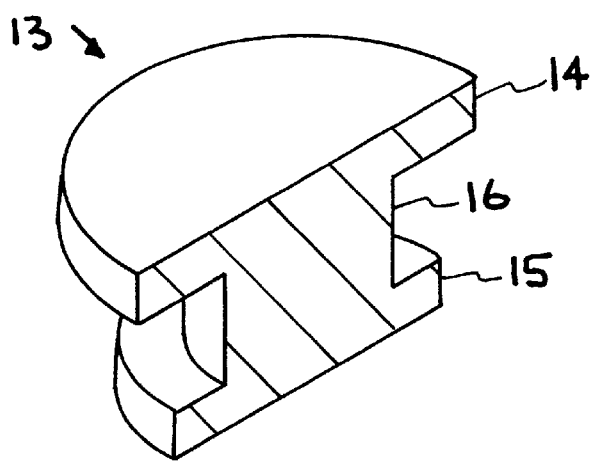
Figure 4:
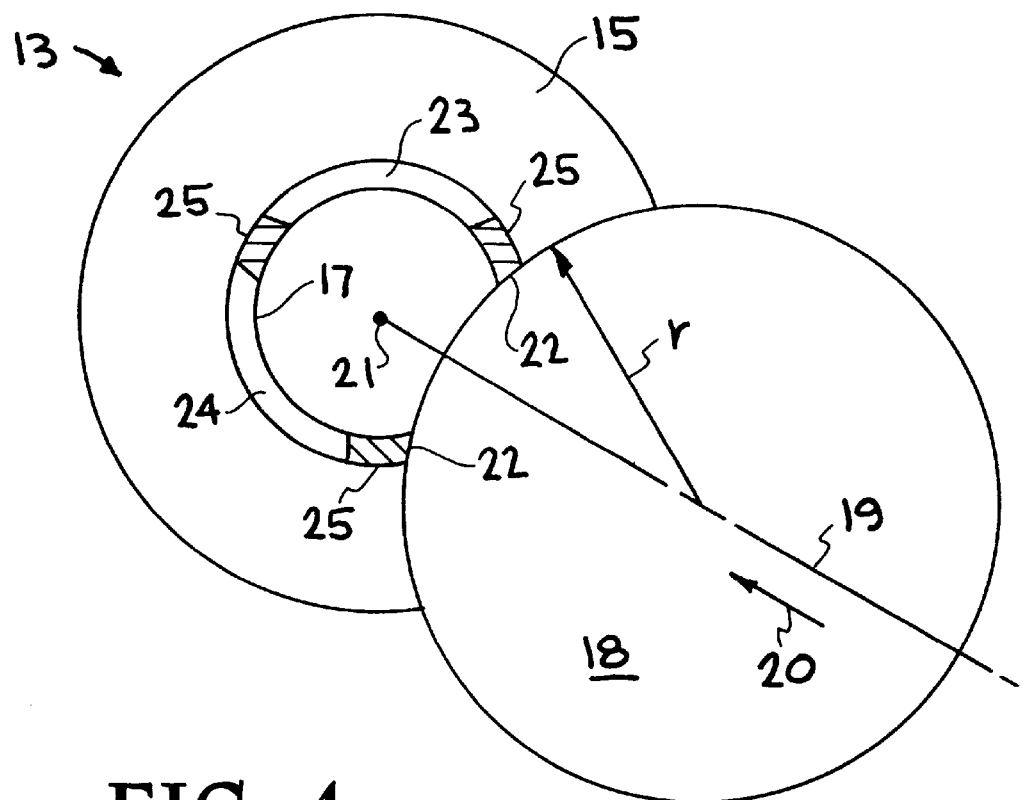
Figure 5:
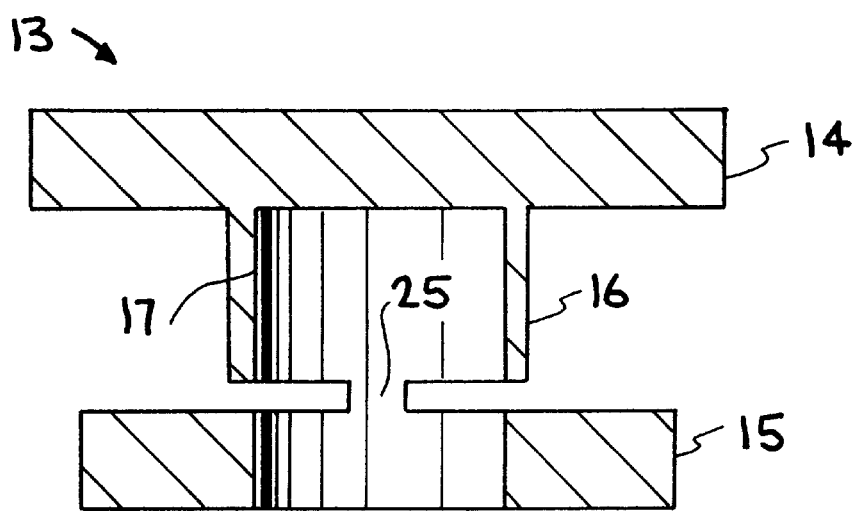
Figure 6:
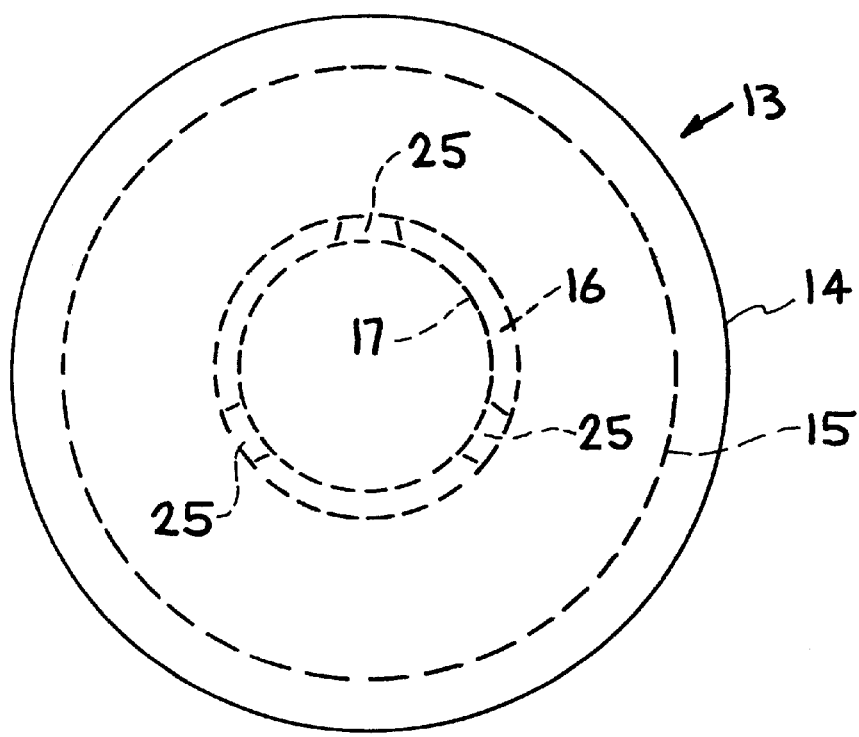
FIG. 6 is a top view of the finished pedestal embodiment fabricated as shown in FIGS. 1–5.
Figure 7:
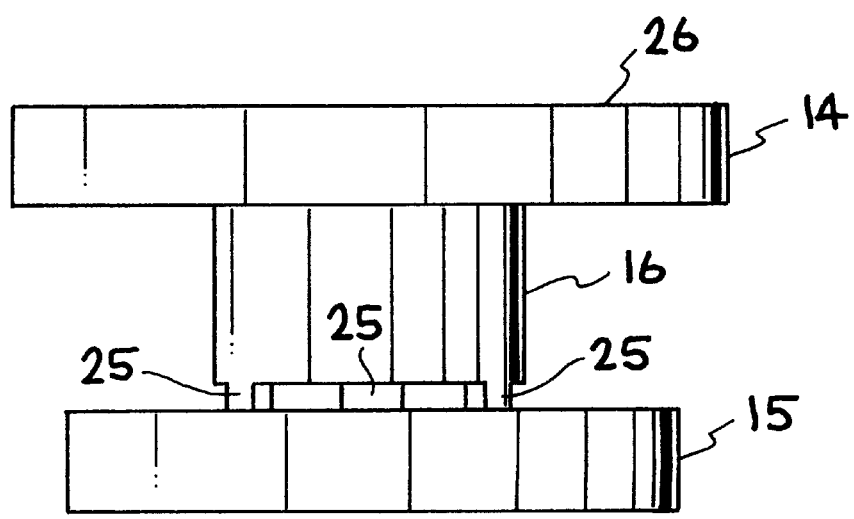
FIG. 7 is an elevation view of the finished pedestal of FIG. 6.

Referring now to the drawings, FIGS. 1–5 illustrate the formation or fabrication of an embodiment of a pedestal substrate from a single piece of material, with the finished pedestal being illustrated in FIGS. 6 and 7. As shown in FIG. 1, block 10 of material is scribed as indicated at 11 with a circular configuration 12 illustrating the optic section of the pedestal substrate to be formed. By known process the material of block 10 is removed to produce a spool shaped member or pedestal 13, as shown in FIG. 2, which consists of an upper flange shape which defines an optic section 14 of the pedestal 13, a lower flange shape which defines a base section 15 of pedestal 13, with the flanges being interconnected by material which defines a connecting section 16 of the pedestal 13. Note that as shown in FIG. 2, base section 15 is of a smaller diameter than optic section 14, but this is not required. Each section can be independently sized to extract maximum benefit.

Figure 3:
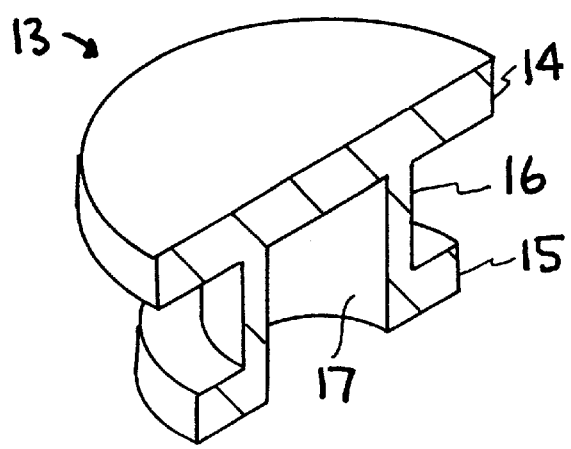

The pedestal 13 of FIG. 2 is further processed as shown in FIG. 3, wherein removal of material from the connecting section 16 and base section 15 produce a hollowed out surface 17 in connecting section 16 and an opening in base section 15.

FIG. 4 is a horizontal cross section taken near where the hollow connecting section 16 joins the base section 15. A cutting tool 18 of radius r, moves along a line indicated at 19 in the direction of arrow 20 towards an axis 21 of pedestal 13 removing material from the connecting section 16 to form a cut-away in connecting section 16 as indicated at 22. The cutting tool 18 is then moved about pedestal 13 and similar cut-aways 23 and 24 are formed, to produce three radial, symmetrically spaced segments or legs 25 adjacent the intersection of the connecting section 16 with the base section 15, as shown in FIG. 5 which illustrates a vertical cross section of pedestal 13 showing one of the three segments or legs 25.

FIG. 6 illustrates a top view of finished pedestal substrate 13, while FIG. 7 illustrates an elevation view of the pedestal substrate 13 having an optical surface 26 on which material is deposited to produce a reflective surface.

Figure 8:
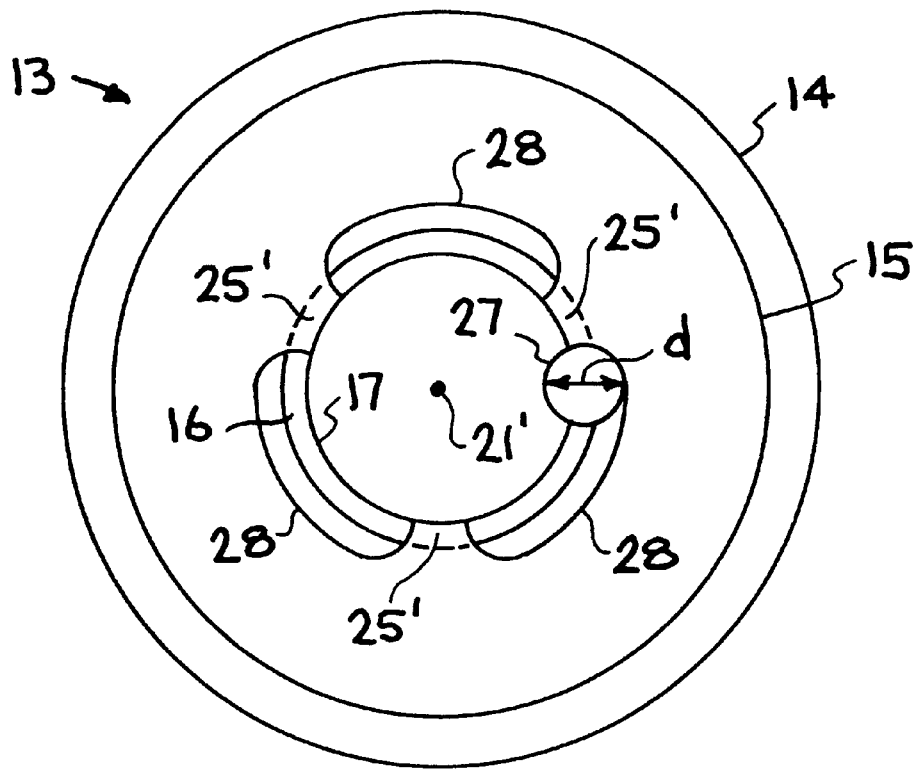
FIGS. 8 and 9 are a bottom view and vertical cross-section view of another pedestal embodiment made similar to FIGS. 1–5, but illustrating a different method of removing material from the connecting section.
Figure 9:
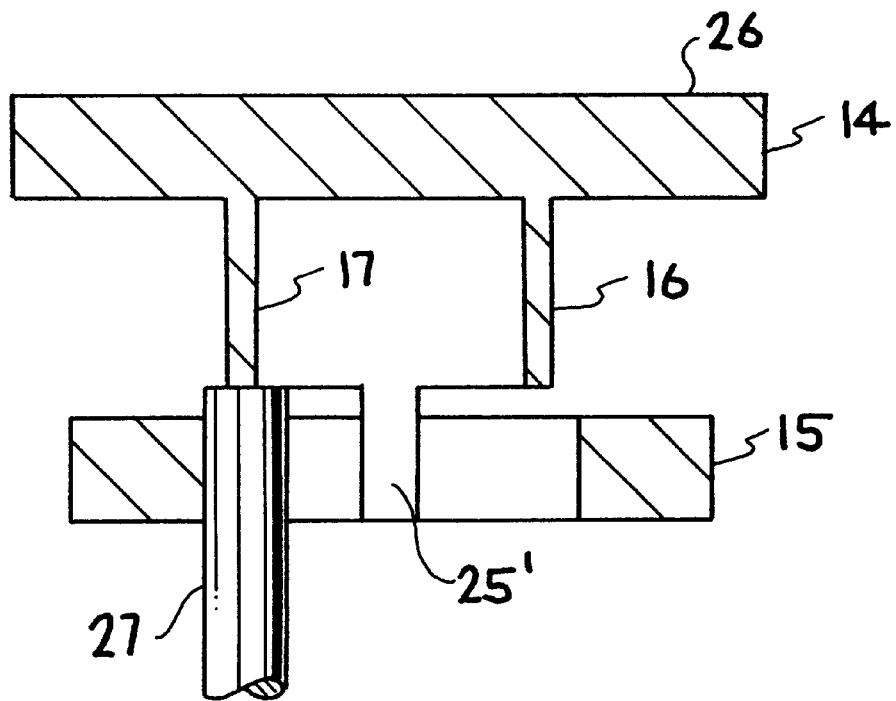

FIGS. 8 and 9 illustrate an embodiment of a pedestal substrate similar to that of FIGS. 6–7 using a different method of removing material from the connecting section 16, and similar components are given corresponding reference numerals. FIG. 8 is a bottom view of the pedestal 13, while FIG. 9 is a vertical cross section thereof, with a cutting tool 27 having a diameter d moving on a circular path indicated at lines 28 about an axis or point 21' which removes material from both the base section 15 and the connecting section 16 to create equally spaced radially symmetric segments or legs 25'.

Figure 10:
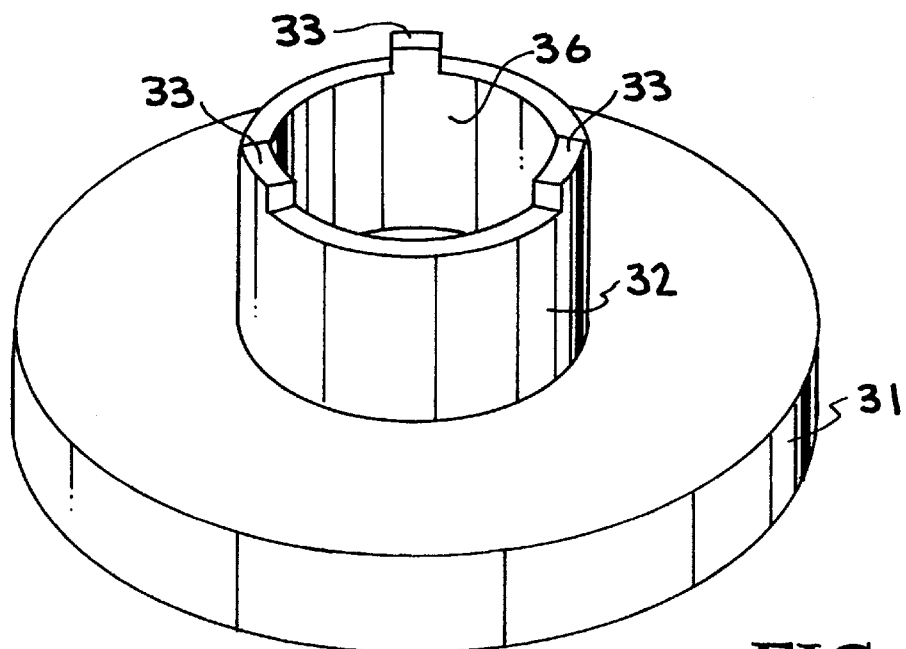
FIGS. 10 and 11 illustrate another embodiment of a pedestal substrate similar to FIGS. 6 and 7 except the base section is fabricated separately, and then bonded or secured to the connection section.
Figure 11:
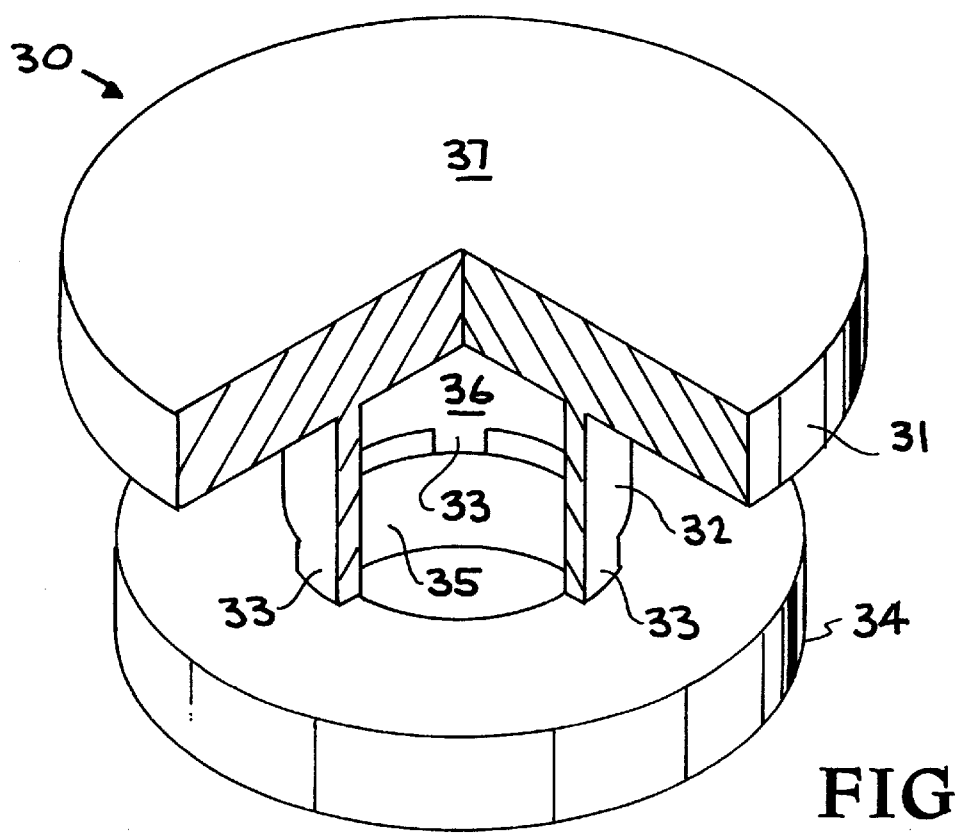

FIGS. 10 and 11 illustrate an embodiment and connecting section are formed integral and the base section is formed separately. As shown, a pedestal substrate 30 is composed of an integral optic section 31 and connecting section 32, with connecting section 32 being hollow and provided with three equally spaced longitudinally extending segments or legs 33. As see in FIG. 11, the integral optic and connecting sections 31 and 32 are mounted on a base section 34 having an opening 35 of a diameter corresponding to the diameter of an inner surface 36 of hollow connecting section 32. The legs 33 are secured, as by bonding, etc., to the base section 34. If desired countersinks may be formed in base section 34 with legs 33 extending thereinto and secured therein. The end result is a pedestal substrate 30 with an optical surface 37, similar to pedestal substrate 13 of FIGS. 6–7.

Figure 12:
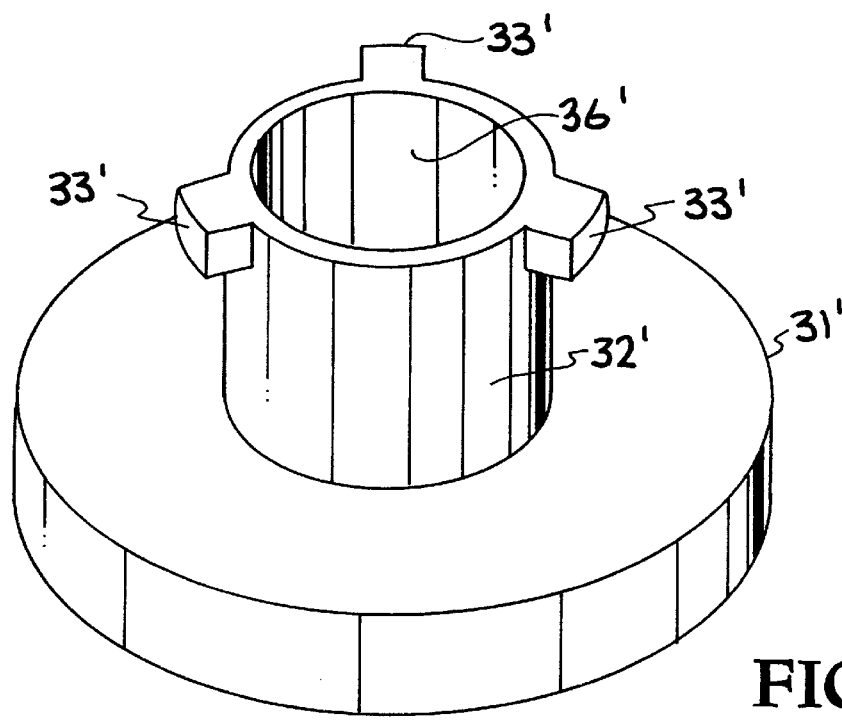
FIGS. 12 and 13 illustrated another embodiment of a pedestal substrate, with the difference from the FIGS. 10–11 embodiment being in the connecting section.
Figure 13:
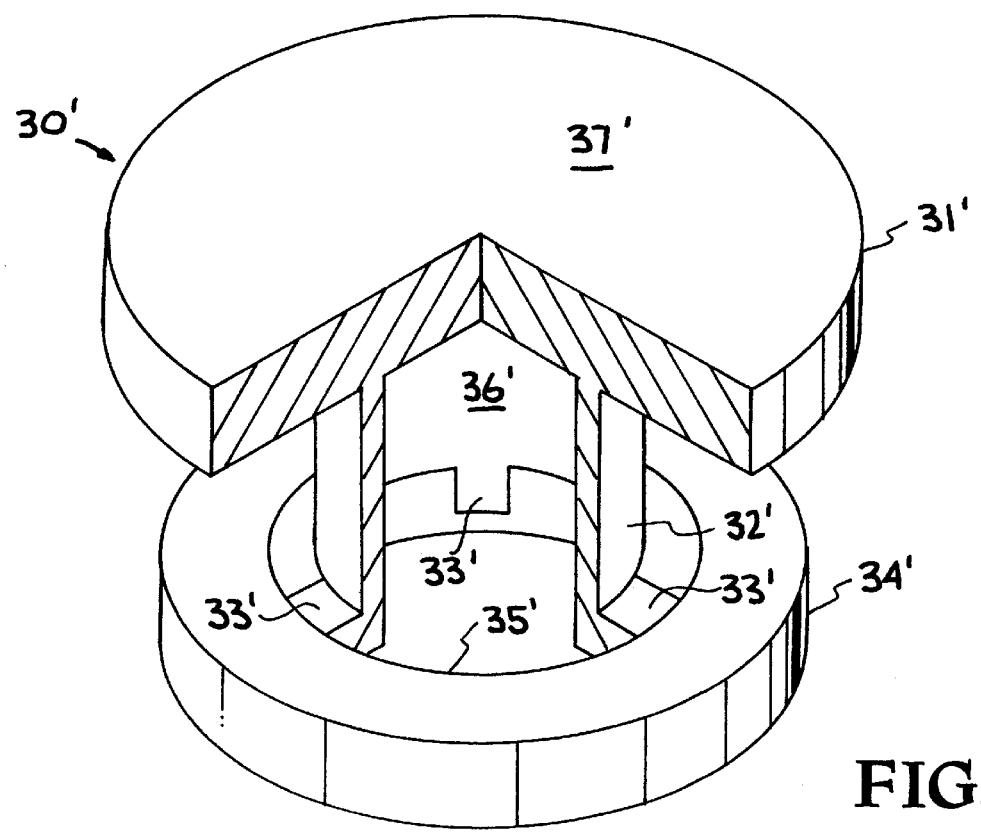

FIGS. 12 and 13 illustrate another embodiment of the pedestal substrate constructed similar to the embodiment of FIGS. 10–11, except for the connecting section. As in FIGS. 10–11, the pedestal substrate 30' includes a topic section 31', having an optic surface 37', made integral with a connecting section 32 which is hollow as indicated by inner surface 36', and is provided with three (3) outwardly protruding or radially extending legs 33' having an outer diameter corresponding to an opening 35' in base section 34'. As seen in FIG. 13, the legs 33' of connecting section 32' extend into opening 35' of base section 34' and are secured therein, such as by bonding, etc. In this embodiment the connecting section 32' can be formed of a smaller diameter than in the embodiment of FIGS. 10–11, with the outer diameter of legs 33' being the same as the diameter of section 32, or the opening 35' in base section 34' can be of larger diameter to accommodate the outwardly protruding legs 33' of connecting section 32'.

While not shown, the base section can be made integral with the connecting section, and the connecting section provided with three (3) legs for securing same to the optic section, or the three sections may be fabricated separately and interconnected by a three leg arrangement, such as illustrated in the embodiment of FIGS. 10–11 and 12–13.

It has thus been shown that the present invention provides a pedestal substrate for coated optics that simultaneously provides high substrate dynamic stiffness, low surface figure sensitivity to mechanical mounting hardware inputs, and constrains surface figure changes caused by optical coatings to be primarily spherical in nature. The pedestal substrate of the invention may be utilized in any optical system requiring coated optics and substrates with reduced sensitivity to mechanical mounts, and is particularly applicable for use in fabrication of optics for an extreme ultraviolet lithography (EUVL) imaging system that requires coated optics with angstrom level control of optical figure.

While particular embodiments of the invention have been illustrated and described to exemplify and explain the principles of the invention, such are not intended to be limiting. Modifications and changes may become apparent to those skilled in the art, and it is intended that the invention be limited only by the scope of the appended claims.

What is claimed is:

1. An optical substrate comprising:
   an optic section having an optical surface to be coated;
   a base section; and
   a connecting section for said optic and base sections,
   said base section including an opening therein and said connecting section being hollow.

2. The optical substrate of claim 1, wherein said optic section, base section, and connecting section are constructed to form a pedestal with said optical surface forming a surface of the optic section.

3. The optical substrate of claim 1, wherein said base section is smaller than said optic section.

4. The optical substrate of claim 1, wherein said optic, base and connecting sections are integral.

5. The optical substrate of claim 1, wherein said optic section and said connecting section are integral.

6. The optical substrate of claim 1, wherein said connecting section is connected to at least said base section at three equally spaced points.

7. The optical substrate of claim 1, wherein said connecting section includes on at least one end portion thereof three legs, said three legs being secured to said base section.

8. The optical substrate of claim 1, wherein said connecting section includes three legs on at least one end thereof, said three legs being integral with at least said base section.

9. The optical substrate of claim 1, wherein said connecting section includes three outwardly protruding legs on at least one end thereof, wherein at least said base section having an opening therein and wherein said outwardly protruding legs are secured and in said opening of at least said base section.

10. The optical substrate of claim 1, wherein said optic, base, and connecting sections are integral, and additionally including a plurality of openings in said connecting sections and adjacent said base section to define a plurality of segments.

11. The optical substrate of claim 10, wherein said plurality of segments define of three equally spaced legs.

12. A substrate for coated optics, comprising:
    a first section defining a base section;
    a second section defining an optic section; and
    a third section interconnecting said first and second sections;

said first, second, and third sections forming a pedestal;

said second section having an outer surface defining an optical surface;

at least said first and third sections being interconnected via a plurality of segments having openings therebetween.

13. The substrate of claim 12, wherein said segments are integral with each of said first section and said third section.

14. The substrate of claim 12, wherein said first, second, and third sections are integral.

15. The substrate of claim 12, wherein said third section is hollow, and wherein said third section has an opening therein.

16. The substrate of claim 12, wherein said plurality of segments comprise three equally spaced segments located adjacent said opening in said first section.

17. The substrate of claim 12, wherein said second and third sections are integral, and wherein said plurality of segments are located at an outer end of said third section, and are selected from the group of longitudinally extending segments and radially extending segments.

18. The substrate of claim 17, wherein said first section includes an opening, wherein said segments on said third section are radially extending, and wherein said radially extending segments are secured in said opening of said first section.

19. The pedestal substrate of claim 17, wherein said first section includes an opening, wherein said segments on said third section are longitudinally extending, and wherein said longitudinally extending segments are secured to said first section adjacent said opening therein.

20. The pedestal substrate of claim 12, wherein said first, second, and third sections are integral;

wherein said third section is hollow, wherein said first section has an opening, and wherein said plurality of segments are formed by removing material selected from the group consisting of removing material adjacent to an upper surface of said first section from said third section to form three equally spaced segments on said third section, and removing material from about said opening in said first section and material from said third section to form three equally spaced segments on said third section.

21. A pedestal configured optical substrate that maintains acceptable figure before and after coating, is not sensitive to mount disturbance loads, and demonstrates high dynamic stiffness, comprising:

a first section defining a disk-like surface to be coated, a second section defining a base, and a connecting section intermediate said first and second sections, said first section having a substantially constant thickness, said second and connecting sections being constructed to define a solid or a hollow configuration.

22. The optical substrate of claim 21, wherein at least said connecting section is hollow, and wherein said connecting section is connected to said second section at a plurality of equally spaced points.

* * * * *